(12) United States Patent
Van Dal et al.

(10) Patent No.: US 7,791,140 B2
(45) Date of Patent: Sep. 7, 2010

(54) DOUBLE-GATE SEMICONDUCTOR DEVICES HAVING GATES WITH DIFFERENT WORK FUNCTIONS AND METHODS OF MANUFACTURE THEREOF

(75) Inventors: Mark Van Dal, Heverlee (BE); Radu Surdeanu, Roosbeek (BE)

(73) Assignee: NXP B.V., Eindhoven (NL)

( * ) Notice: Subject to any disclaimer, the term of this patent is extended or adjusted under 35 U.S.C. 154(b) by 133 days.

(21) Appl. No.: 12/278,629

(22) PCT Filed: Feb. 2, 2007

(86) PCT No.: PCT/IB2007/050357
§ 371 (c)(1),
(2), (4) Date: Aug. 7, 2008

(87) PCT Pub. No.: WO2007/093930
PCT Pub. Date: Aug. 23, 2007

(65) Prior Publication Data
US 2009/0242987 A1 Oct. 1, 2009

(30) Foreign Application Priority Data
Feb. 13, 2006 (EP) .................................. 06101603

(51) Int. Cl.
*H01L 27/12* (2006.01)
*H01L 21/62* (2006.01)
*H01L 21/20* (2006.01)

(52) U.S. Cl. ............................. 257/347; 257/E27.112; 257/E21.561; 257/E21.09; 438/479
(58) Field of Classification Search .................. 257/347, 257/E27.112, E21.561, E21.09; 438/479
See application file for complete search history.

(56) References Cited

U.S. PATENT DOCUMENTS

| 6,611,029 | B1 * | 8/2003 | Ahmed et al. | 257/365 |
| 6,853,020 | B1 * | 2/2005 | Yu et al. | 257/270 |
| 6,855,989 | B1 | 2/2005 | Wang et al. | |
| 7,288,805 | B2 * | 10/2007 | Anderson et al. | 257/250 |
| 2003/0193065 | A1 | 10/2003 | Fried et al. | |
| 2004/0100306 | A1 * | 5/2004 | Krivokapic et al. | 326/112 |
| 2005/0051843 | A1 | 3/2005 | Inaba | |
| 2005/0153485 | A1 | 7/2005 | Ahmed et al. | |
| 2005/0199948 | A1 | 9/2005 | Lee et al. | |
| 2007/0029623 | A1 | 2/2007 | Liu et al. | |

FOREIGN PATENT DOCUMENTS

| WO | 2005055326 A | 6/2005 |
| WO | 2006122956 A | 11/2006 |

* cited by examiner

*Primary Examiner*—Luan C Thai

(57) ABSTRACT

A double-gate FinFET and methods for its manufacture are provided. The FinFET includes first and second gates (72, 74) adjacent respective sides of the fin (20), with at least a portion of the first gate facing the fin being formed of polycrystalline silicon, and at least a portion of the second gate facing the fin being formed of a metal silicide compound. The different compositions of the two gates provide different respective work functions to reduce short channel effects.

12 Claims, 6 Drawing Sheets

DOUBLE-GATE SEMICONDUCTOR DEVICES HAVING GATES WITH DIFFERENT WORK FUNCTIONS AND METHODS OF MANUFACTURE THEREOF

This invention relates to double-gate semiconductor devices and methods for manufacturing such devices. In particular, it relates to insulated-gate field-effect transistors having double-gate configurations.

There is a continual desire to increase the density of semiconductor devices in integrated circuits which therefore requires reduction in the dimensions of such devices. However, when the gate length of conventional devices is reduced to below around 100 nm, problems associated with short channel effects, such as excessive leakage between the source and drain, are encountered.

New device configurations are therefore needed to allow further reduction in the dimensions of devices. A new structure that has been developed is the double-gate metal oxide semiconductor field-effect transistor (MOSFET), in which two gates may be used in order to control short channel effects. A FinFET is a double-gate architecture that can provide good short channel behaviour.

U.S. Pat. No. 6,853,020 discloses a FinFET. A channel is formed in a vertical fin of semiconductor material with the two gates on opposite sides of the fin. Each gate is doped with a dopant of opposite conductivity type to the other resulting in different respective work functions.

The present invention provides a semiconductor device including a fin of semiconductor material on an insulating substrate; a first gate separated from a first side of the fin by a gate dielectric layer, with at least a portion of the first gate facing the fin being formed of polycrystalline silicon; and a second gate separated by a gate dielectric layer from a second side of the fin which is opposite to the first side, with at least a portion of the second gate facing the fin being formed of a metal silicide compound.

With the portion of the first gate facing the fin being formed of polycrystalline silicon, and the corresponding portion of the second gate being formed of a metal silicide compound, the two gates exhibit different work functions, leading to better short channel control.

The first gate and/or the second gate may be doped with dopant atoms. Variations of the type of dopant and its concentration may be used to alter the work function of the respective gate. Thus, doping one or both gates in this may be employed to tune the work function of the respective gate in a well controllable manner. The dopant atoms may comprise arsenic atoms for example.

In addition, different silicide phases may be selected for the second gate (by modifying the ratio of semiconductor to metal material therein) to alter its work function independently of that of the first gate. Furthermore, the work function of the second gate may also be altered by changing the metal used to form the silicide.

In a preferred embodiment, a layer of a metal silicide compound is formed over the polycrystalline silicon portion of the first gate. Such a layer may serve to reduce the series resistance of the gate by providing a lower resistance path from the polycrystalline silicon portion to the gate electrode of the device.

The present invention further provides a method of manufacturing a double-gate semiconductor device which includes the steps of:

(a) providing an insulating substrate having a top surface;
(b) forming a fin of semiconductor material on the top surface of the insulating substrate, the fin having first and second opposite sides;
(c) depositing a layer of polycrystalline silicon;
(d) forming a localised oxide layer over a portion of the polycrystalline silicon layer which extends over the first side of the fin;
(e) depositing a metal layer; and
(f) annealing such that a metal silicide compound is formed by the polycrystalline silicon and metal overlying the second side of the fin.

Formation of a localised oxide layer in step (d) leads to selective formation of a metal silicide compound, that is, in those regions where the oxide layer is not present, including a region overlying the second side of the fin, whilst polycrystalline silicon remains over the first side of the fin.

In a preferred embodiment of the method of the invention, localised oxide layer formation step (d) comprises the steps of:

projecting ions towards the substrate, at a non-perpendicular angle relative to its top surface, such that a greater number of ions are implanted in a portion of the polycrystalline silicon layer overlying the second side of the fin than a portion overlying the first side thereof;

oxidising the outer surface of the polycrystalline silicon layer, the greater number of implanted ions present in said portion of the polycrystalline silicon layer overlying the second side of the fin resulting in a thinner oxide layer being formed thereover relative to that over said portion of the polycrystalline silicon layer overlying the first side of the fin; and etching away oxide material isotropically to leave said localised layer.

In an alternative preferred embodiment of the method, localised oxide layer formation step (d) comprises the steps of:

forming a layer of oxide material over the polycrystalline silicon layer;

projecting ions towards the substrate, at a non-perpendicular angle relative to its top surface, such that a greater number of ions are implanted in a portion of the oxide layer overlying the second side of the fin than a portion overlying the first side thereof;

etching away oxide material to leave said localised layer, the greater number of implanted ions present in said portion of the oxide layer overlying the second side of the fin causing it to etch away more quickly than that portion of the oxide layer overlying the first side of the fin.

The layer of oxide material over the polycrystalline silicon layer may be formed by oxidising the outer surface of the polycrystalline silicon layer for example. Alternatively, it may be deposited.

Preferably, the projected ions comprise nitrogen ions.

It will be appreciated that a wide range of metals may be employed to form metal silicide compounds in carrying out methods in accordance with the present invention. Preferably, the metal used is nickel or platinum.

Preferably, the separate first and second gates are formed on either side of the gate by removing material overlying the top of the fin. This material is preferably removed by chemical-mechanical polishing (CMP). This step may be executed at a number of stages during the manufacturing process. Preferably it is carried out after a layer of polycrystalline silicon is deposited in step (c). Alternatively, it may involve removing metal silicide material overlying the top of the fin after step (f).

Embodiments of the invention will now be described by way of example and with reference to the accompanying schematic drawings, wherein.

Figure 11:
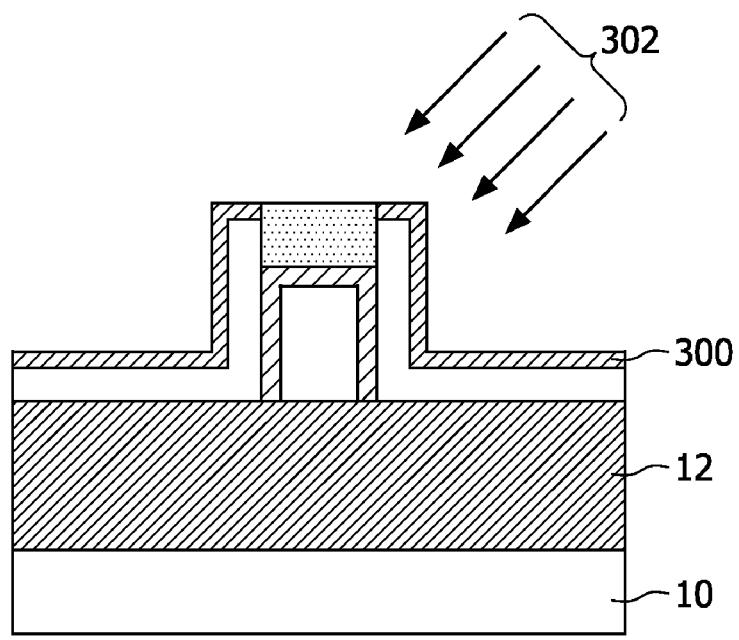
Figure 12:
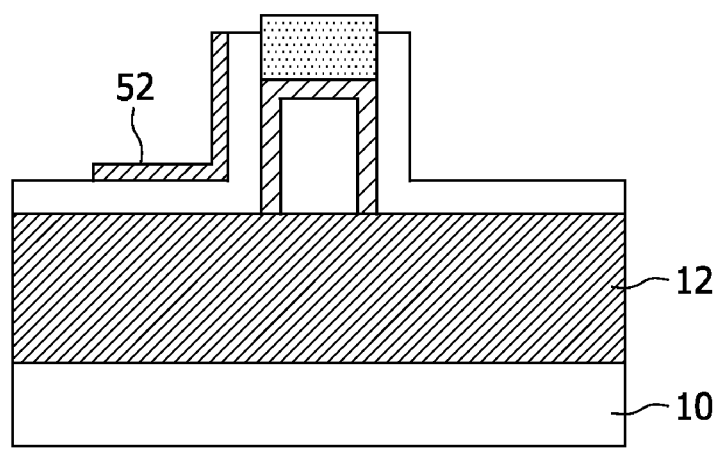

and FIGS. 11 and 12 are cross-sectional views of a semiconductor device at intermediate stages in its manufacture by a second example of a method embodying the invention.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

Figure 1:
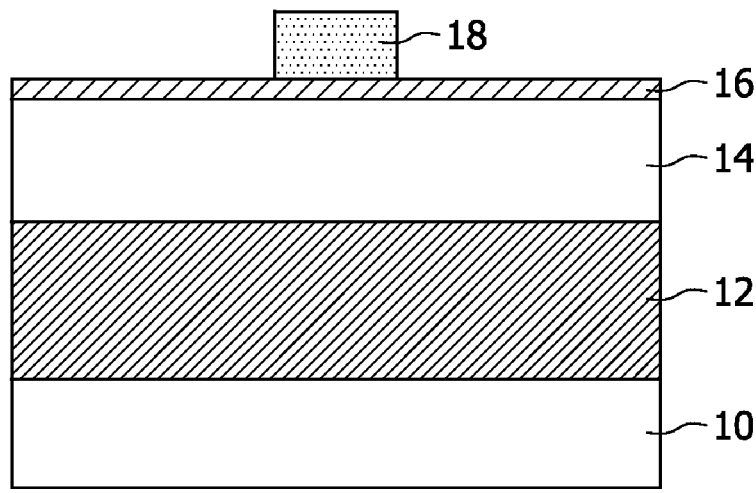
FIGS. 1 to 9 are cross-sectional views of a semiconductor device at successive stages in its manufacture according to one example of a method embodying the present invention.

FIG. 1 shows a cross-section through a substrate at the first stage of a method for manufacturing a double-gate FinFET embodying the present invention. The substrate is a silicon-on-insulator (SOI) structure, comprising a silicon substrate 10, a buried oxide layer 12, and a monocrystalline silicon layer 14 on the buried oxide layer 12.

Buried oxide layer 12 may be formed of a silicon oxide, such as silicon dioxide, and have a thickness of about 100 to 500 nm. Preferably, this layer is about 150 nm thick. Silicon layer 14 may include monocrystalline or polycrystalline silicon and be about 20 to 200 nm thick. Preferably, it is about 70 nm thick. It will be appreciated that substrate 10 and layer 14 may comprise other semiconducting materials beside silicon, such as germanium, or combinations of semiconducting materials, such as silicon-germanium. Buried oxide layer 12 may also be formed of dielectric materials other than silicon oxide.

Optionally, a dielectric layer 16, formed of silicon nitride or silicon oxide for example, may be formed over silicon layer 14 to act as a protective cap during subsequent etching processes. A mask 18 is provided by patterning a uniform layer of a suitable material in a conventional manner. It may be formed of silicon dioxide, silicon nitride, SiON or SiOC, for example.

Figure 2:
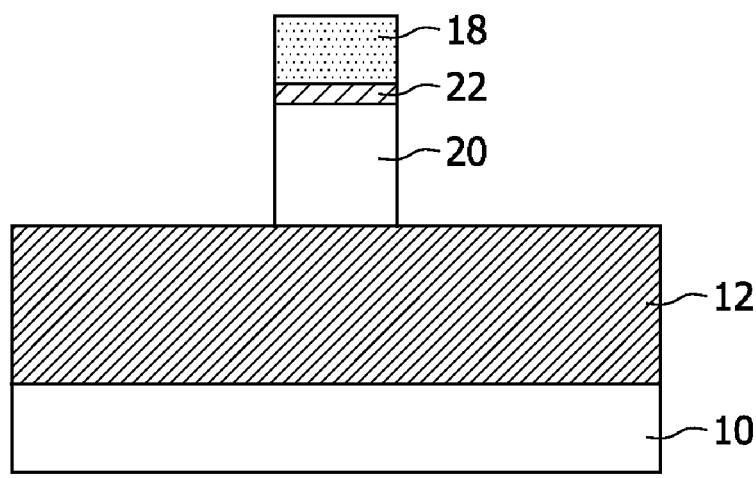

As shown in FIG. 2, silicon layer 14 (and dielectric layer 16, if present) are then etched away at windows defined by photoresist mask 18 using a suitable conventional anisotropic etchant. This forms a silicon fin 20 on the oxide layer 12. The fin has a cap 22 of dielectric material remaining thereover from layer 16.

Source and drain regions may be formed at the same time as the fin and adjacent to respective ends of the fin, using the mask 18. Source and drain regions 200, 202, respectively, are shown in a plan view of a finished device in FIG. 10.

A dielectric layer is then provided over the exposed sides of the fin 20, in the form of vertical layers 30, 32 on the first and second sides of the fin, respectively. These layers may be formed for example by oxidation of the sidewalls of the silicon fin.

Figure 3:
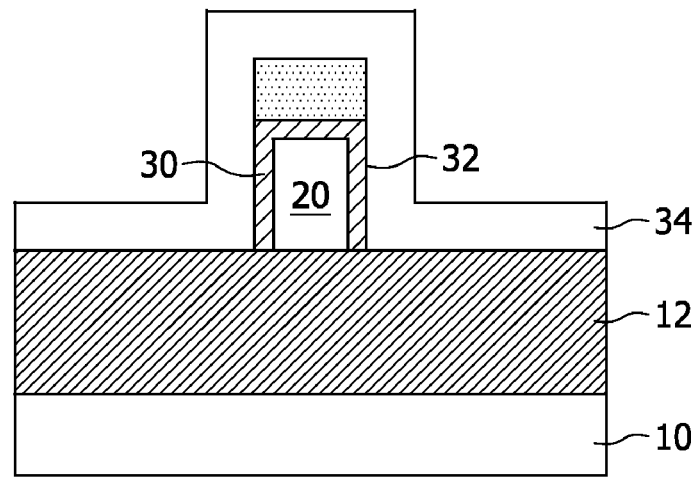

A layer 34 of polycrystalline silicon is then deposited over the substrate (see FIG. 3). This layer is about 50 to 300 nm thick, and preferably about 100 to 200 nm thick. Polycrystalline layer 34 may then be doped with an n-type or p-type impurity. Preferably, the dopant is arsenic, phosphorous or boron. It may be implanted at a dosage in the range of about $1\times10^{14}$ atoms/cm$^2$ to about $6\times10^{15}$ atoms/cm$^2$, typically around $1\times10^{15}$ atoms/cm$^2$, and an implantation energy of about 2 to about 40 KeV (depending on the dopant used). If appropriate, one of the sides of the fin may be masked during this process.

Figure 4:
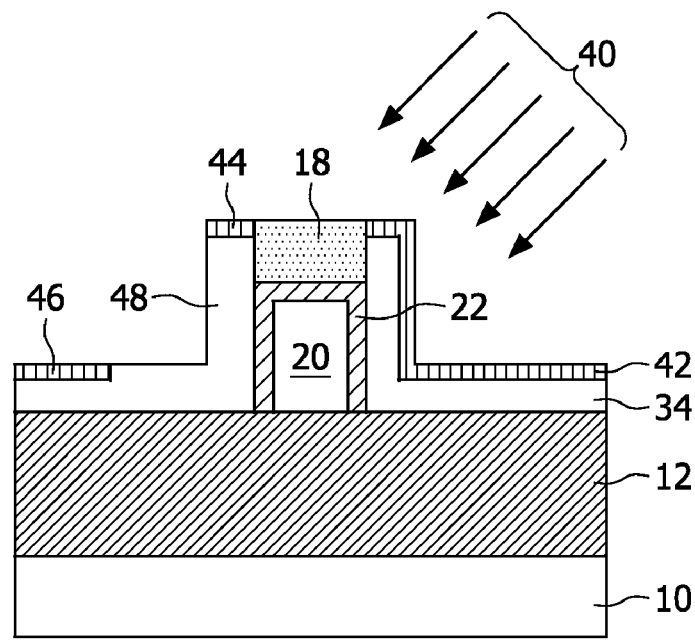

A portion of polycrystalline silicon layer 34 which extends over the top of the fin 20 is then removed by a CMP process, as shown in FIG. 4. This serves to separate the portions of this layer which extend over the first and second sides of the fin, respectively. The thickness of the mask layer 18 over the fin is selected to allow sufficient tolerance in the end point of the CMP step so as to ensure separation of the polycrystalline layer into two parts, without impinging on dielectric layer 22.

Next, as also shown in FIG. 4, an ion implantation phase is carried out, in which ions 40 are projected at an angle towards the substrate. This angle results in an asymmetric implantation of the ions, resulting in a much greater concentration of the ions on the surface of the polycrystalline layer 34 at regions 42, 44 and 46. Region 48 of the polycrystalline silicon layer, which extends over the first side of the fin, is shielded from the ion implantation by the upstanding structure containing the fin and so has a lower concentration of ions than regions 42, 44 and 46.

Figure 5:
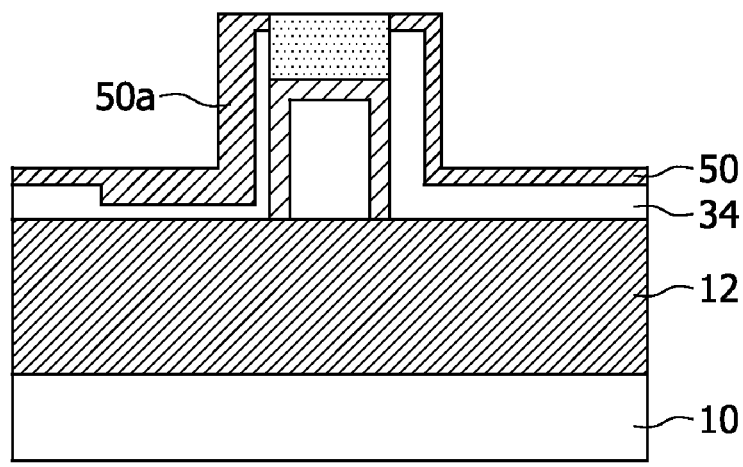

An oxidisation process is then carried out resulting in an oxide layer 50 over the polycrystalline silicon layer 34, as shown in FIG. 5.

The implanted ions may comprise nitrogen or arsenic.

Regions of the polycrystalline silicon layer 34 having a greater concentration of implanted ions at their surface oxidise more slowly than those with a lower ion concentration. This results in the formation of a thicker oxide layer 50a over the first side of fin 20 than elsewhere, as shown in FIG. 5. The difference in oxidation rates may be a factor of 5.

Figure 6:
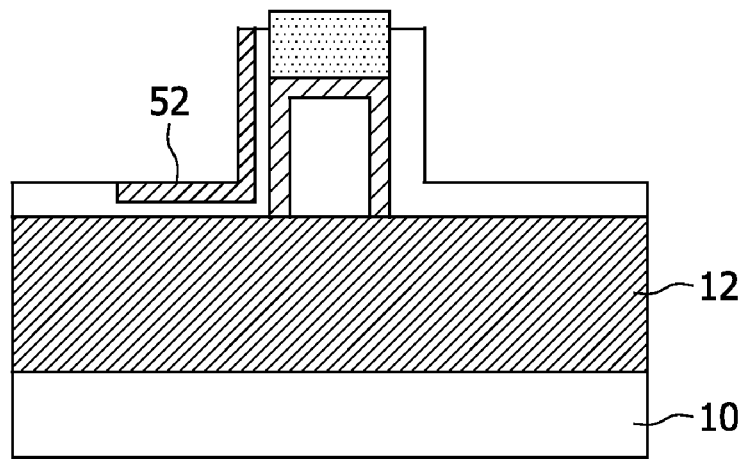

A timed isotropic etch process is then carried out to remove a uniform depth of the oxide layer 50. A suitable etchant is HF solution, for example. The etch is carried out until an oxide layer only remains over region 50a, where a thicker layer was originally formed. Region 50a thus forms an L-shaped spacer 52, as illustrated in FIG. 6.

Figure 7:
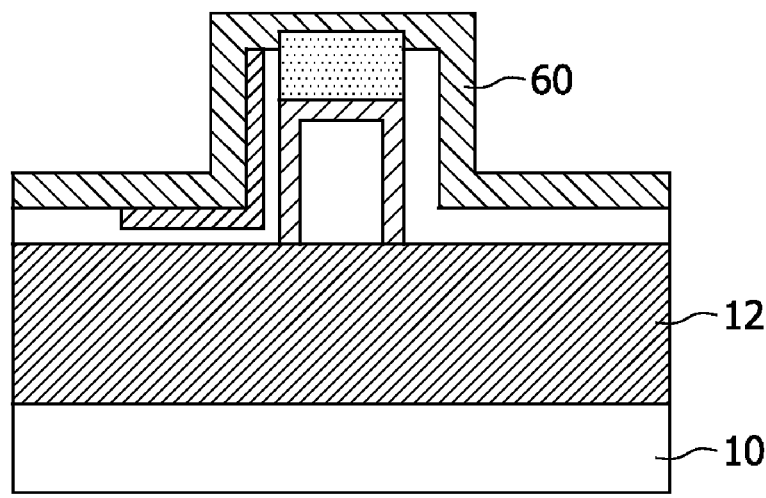

As shown in FIG. 7, a metal layer 60 is then deposited, for example by sputter deposition. The metal may be platinum, nickel, ytterbium or erbium, for example. Alternatively, other metals may be used. The thickness of this metal layer may be in the range of about 20 to 200 nm, depending on the silicide to be formed and the thickness of the polycrystalline semiconductor layer 34.

Figure 8:
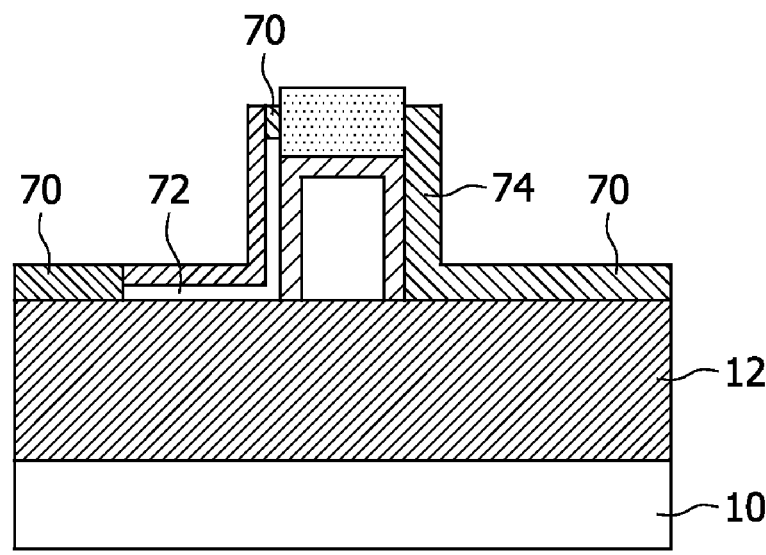

A thermal annealing process is then carried out to create a metal silicide compound where the metal layer 60 is in contact with the underlying polycrystalline silicon layer 34. This forms metal silicide regions 70 which are fully silicided. This results in the device shown in FIG. 8 having a first gate 72 of polycrystalline silicon adjacent a first side of fin 20 and a second gate 74 of a metal silicide compound adjacent the second side of the fin 20.

It will be appreciated that the thickness of the mask 18 needs to be great enough to ensure that the metal silicide does not reach the top of the fin.

In a preferred embodiment, further steps are carried out, comprising removal of the oxide spacer 52 using a suitable etch process, deposition of a further metal layer, and then a thermal annealing step to silicide the now exposed polycrystalline silicon layer over the first side of the fin 20. This results in the structure shown in FIG. 9 having the additional silicide layer 70a over the first gate 72, after removal of any unsilicided metal. Silicide layer 70a serves to reduce the series resistance of the connection to the first gate 72.

Figure 9:
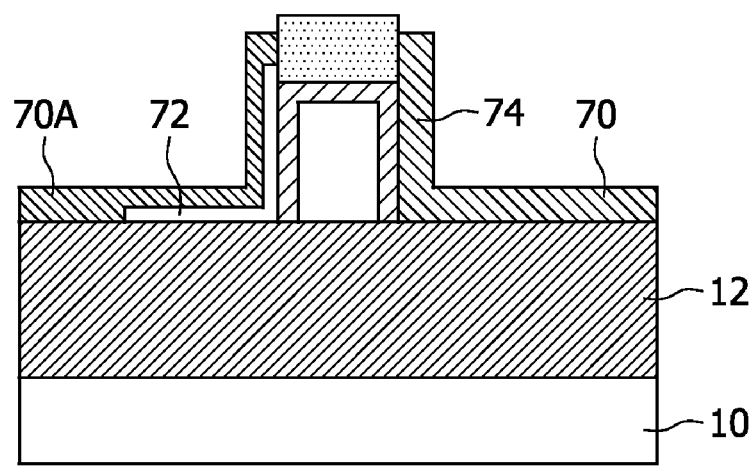
Figure 10:
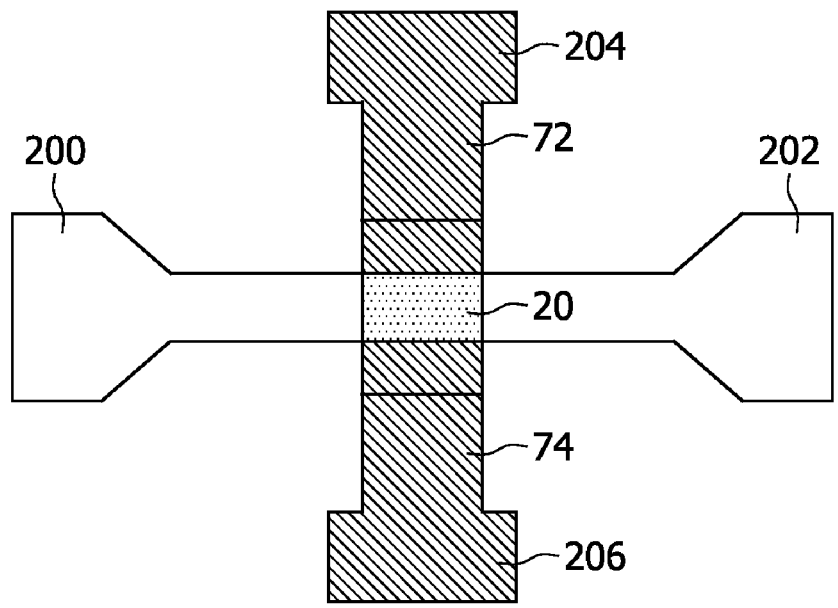
FIG. 10 is a plan view of the semiconductor device shown in FIG. 9.

A plan view of the finished device shown in FIG. 9 is illustrated in FIG. 10. Source and drain regions, 200 and 202, respectively, extend from opposite ends of the fin 20. First and second gates, 72 and 74, respectively, extend from opposite sides of the fin 20. They may be patterned and etched to form respective gate electrodes or contacts 204 and 206.

Source and drain regions 200, 202 may be doped with n-type or p-type impurities.

An alternative method of forming the L-shaped oxide spacer 52 will now be described with reference to FIGS. 11 and 12. This process may replace the intermediate steps described above with reference to FIGS. 4 to 6.

Starting from the stage shown in FIG. 3, an oxide layer 300 is then provided over the polycrystalline silicon layer 34. It may be formed for example by oxidation of the polycrystalline silicon layer (as is the case in FIG. 11), or by deposition. The oxide may be silicon dioxide for example, and the layer may be about 5 to 20 nm thick. An angled ion implantation is then carried out in a similar manner to that described with reference to FIG. 4 above. The ions 302 may be nitrogen ions for example. Due to the "shadow effect" described above, a lower concentration of ions is implanted in the portion of the oxide layer 300 overlying the first side of the fin 20.

An etch process is then carried out, resulting in the L-shaped spacer 52 of oxide shown in FIG. 12. The etch is carried out using an etching solution selective between the regions of oxide having different nitrogen ion concentrations, such as HF solution, for example. The L-shaped substantially non-ion implanted portion 52 remains, whilst the remainder of oxide layer 300 is selectively etched away. Further processing may then be carried out as described with reference to FIG. 7 above in order to form the finished device.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. A semiconductor device including:
   a fin of semiconductor material on an insulating substrate;
   a first gate separated from a first side of the fin by a gate dielectric layer, with at least a portion of the first gate facing the fin being formed of polycrystalline silicon, the polycrystalline silicon extending over the first side of the fin;
   wherein a localised oxide layer is over a portion of the polycrystalline silicon; and
   a second gate separated by a gate dielectric layer from a second side of the fin which is opposite to the first side, characterised in that the second gate is opposite the first gate and at least a portion of the second gate facing the fin comprises a fully silicided metal silicide region.

2. A device of claim 1 wherein at least a portion of the first gate and/or the second gate near to the fin is doped with dopant atoms.

3. A device of claim 2 wherein the dopant atoms comprise arsenic atoms.

4. A device of claim 1 wherein a layer of a metal silicide compound is formed over the polycrystalline silicon portion of the first gate.

5. A method of manufacturing a semiconductor device the method comprising:
   providing an insulating substrate having a top surface;
   forming a fin of semiconductor material on the top surface of the insulating substrate, the fin having first and second opposite sides;
   depositing a layer of polycrystalline silicon;
   forming a localised oxide layer over a portion of the polycrystalline silicon layer which extends over the first side of the fin;
   depositing a metal layer; and
   annealing such that a fully silicided metal silicide region is formed where the metal layer is in contact with the underlying polycrystalline silicon layer overlying the second side of the fin.

6. The method as recited in claim 5, wherein forming a localised oxide layer comprises:
   projecting ions towards the substrate, at a non-perpendicular angle relative to its top surface, such that a greater number of ions are implanted in a portion of the polycrystalline silicon layer overlying the second side of the fin than a portion overlying the first side thereof;
   oxidising the outer surface of the polycrystalline silicon layer, the greater number of implanted ions present in said portion of the polycrystalline silicon layer overlying the second side of the fin resulting in a thinner oxide layer being formed thereover relative to the oxide layer over said portion of the polycrystalline silicon layer overlying the first side of the fin; and
   etching away oxide material isotropically to leave said localised layer.

7. The method as recited in claim 5, wherein forming a localised oxide layer comprises:
   forming a layer of oxide material over the polycrystalline silicon layer
   projecting ions towards the substrate, at a non-perpendicular angle relative to its top surface, such that a greater number of ions are implanted in a portion of the oxide layer overlying the second side of the fin than a portion overlying the first side thereof;
   etching away oxide material to leave said localised layer, the greater number of implanted ions present in said portion of the oxide layer overlying the second side of the fin causing it to etch away more quickly than that portion of the oxide layer overlying the first side of the fin.

8. The method as recited in claim 6, wherein the projected ions comprise nitrogen.

9. The method as recited in claim 5, wherein the metal layer is formed of nickel or platinum.

10. The method as recited in claim 5 further including removing material in the polycrystalline silicon layer overlying the top of the fin to separate the portions on either side of the gate.

11. The method as recited in claim 5, further including after annealing such that a fully silicided metal silicide region is formed,
   removing metal silicide material overlying the top of the fin to form the first and second separate gates on respective sides of the fin.

12. The method as recited in claim 10, wherein the material is removed by CMP.

* * * * *